United States Patent
Su

(10) Patent No.: US 7,763,522 B2
(45) Date of Patent: Jul. 27, 2010

(54) METHOD OF HIGH DENSITY PLASMA GAP-FILLING WITH MINIMIZATION OF GAS PHASE NUCLEATION

(75) Inventor: Shih-Feng Su, Kaohsiung (TW)

(73) Assignee: United Microelectronic Corp., Hsinchu (TW)

( * ) Notice: Subject to any disclaimer, the term of this patent is extended or adjusted under 35 U.S.C. 154(b) by 126 days.

(21) Appl. No.: 11/832,166

(22) Filed: Aug. 1, 2007

(65) Prior Publication Data

US 2009/0035915 A1 Feb. 5, 2009

(51) Int. Cl.
*H01L 21/76* (2006.01)
(52) U.S. Cl. ............... 438/424; 438/435; 257/E21.252
(58) Field of Classification Search .......... 257/E21.279, 257/E21.54, E21.546, E21.548, E21.549, 257/E21.252; 438/400, 424, 427, 435, 694, 438/787, 788; 427/255.37
See application file for complete search history.

(56) References Cited

U.S. PATENT DOCUMENTS

| | | | |
|---|---|---|---|
| 6,802,944 B2 * | 10/2004 | Ahmad et al. .......... 204/192.23 |
| 6,808,748 B2 * | 10/2004 | Kapoor et al. ......... 427/255.31 |
| 7,078,312 B1 | 7/2006 | Sutanto et al. |
| 7,435,684 B1 * | 10/2008 | Lang et al. .................. 438/695 |
| 2004/0241342 A1 * | 12/2004 | Karim et al. ................ 427/585 |
| 2006/0231032 A1 * | 10/2006 | Murakami et al. ...... 118/723 R |

* cited by examiner

*Primary Examiner*—David S Blum
(74) *Attorney, Agent, or Firm*—J.C. Patents

(57) ABSTRACT

A method of high density plasma (HDP) gap-filling with a minimization of gas phase nucleation (GPN) is provided. The method includes providing a substrate having a trench in a reaction chamber. Next, a first deposition step is performed to partially fill a dielectric material in the trench. Then, an etch step is performed to partially remove the dielectric material in the trench. Thereafter, a second deposition step is performed to partially fill the dielectric material in the trench. A reaction gas used in the second deposition step includes a carrier gas, an oxygen-containing gas, a silicon-containing gas, and a hydrogen-containing gas. After the carrier gas and oxygen-containing gas are introduced into the reaction chamber and a radio frequency (RF) power is turned on for a period of time, the silicon-containing gas and hydrogen-containing gas are introduced into the reaction chamber.

18 Claims, 7 Drawing Sheets

METHOD OF HIGH DENSITY PLASMA GAP-FILLING WITH MINIMIZATION OF GAS PHASE NUCLEATION

BACKGROUND OF THE INVENTION

1. Field of the Invention

The present invention relates to a semiconductor process. More particularly, the present invention relates to a method of high density plasma (HDP) gap-filling with a minimization of gas phase nucleation (GPN).

2. Description of Related Art

With the progress of semiconductor technology, devices are gradually miniaturized to deep submicron level, or even smaller. Therefore, isolation between devices becomes quite important to avoid short circuit occurring between adjacent devices. Generally speaking, an isolating layer is formed between the devices, and the commonly used technique is local oxidation of silicon (LOCOS). However, LOCOS still has many defects including problems derived from the generation of stress, and Bird's Beak formed around the isolation structure which, among others, seriously obstructs the improvement of device integration. Therefore, the most commonly used method at present is shallow trench isolation (STI) process.

The method of fabricating the STI mainly includes forming a trench in a substrate and filling a dielectric material in the trench to serve as the isolating layer. Generally speaking, high density plasma (HDP) chemical vapor deposition (CVD) is usually used in this field for gap-filling of the isolating layer, and the dielectric material used is silicon dioxide ($SiO_2$). However, as a process line width is reduced, an aspect ratio (AR) of the depth and width of the trench is increased accordingly. Thus, voids are generated during the gap-filling of the isolating layer, and the difficulty is also increased. Therefore, in the gap-fill process of STI of 90 nm and sub-90 nm, a multi-step gap-fill method of deposition-etch-deposition (DED) is developed to obtain an STI of high AR and without voids.

However, the multi-step gap-fill process has disadvantages that when switching from the etch step to the deposition step, serious gas phase nucleation (GPN) occurs due to the unstable plasma caused by the conversion of reaction gas. Consequently, due to the defect of GPN, the STI is projected and scratches products, thus reducing the reliability of the device, and the STI is liable to be attached on walls of a reaction chamber, thus causing contamination. Particularly, as the semiconductor process has reached nanometer level currently, a tolerance for contamination caused by the defect of GPN is much lower.

SUMMARY OF THE INVENTION

Accordingly, the present invention is directed to providing a method of HDP gap-filling with a minimization of GPN, which alleviates the GPN phenomenon occurring in a reaction chamber during the multi-step gap-fill process of the trench to achieve a minimization of GPN.

A method of HDP gap-filling with a minimization of GPN is provided. The method includes providing a substrate having a trench in a reaction chamber. Next, a first deposition step is performed to partially fill a dielectric material in the trench. Then, an etch step is performed to partially remove the dielectric material in the trench. Thereafter, a second deposition step is performed to partially fill the dielectric material in the trench. A reaction gas used in the second deposition step includes a carrier gas, an oxygen-containing gas, a silicon-containing gas and a hydrogen-containing gas. After the carrier gas and the oxygen-containing gas are introduced into the reaction chamber and a radio frequency (RF) power is turned on for a period of time, the silicon-containing gas and the hydrogen-containing gas are introduced into the reaction chamber.

In the method of HDP gap-filling with a minimization of GPN according to an embodiment of the present invention, the method further includes repeating the etch step and the second deposition step until the dielectric material fills up the trench.

In the method of HDP gap-filling with a minimization of GPN according to an embodiment of the present invention, the reaction gas used in the first deposition step includes a carrier gas, an oxygen-containing gas, a silicon-containing gas and a hydrogen-containing gas. After the carrier gas and the oxygen-containing gas are introduced into the reaction chamber and the RF power is turned on for a period of time, the silicon-containing gas and the hydrogen-containing gas are introduced into the reaction chamber.

In the method of HDP gap-filling with a minimization of GPN according to an embodiment of the present invention, the carrier gas is an inert gas.

In the method of HDP gap-filling with a minimization of GPN according to an embodiment of the present invention, in the second deposition step, after the carrier gas and the oxygen-containing gas are introduced into the reaction chamber and the RF power is turned on for a period of time, the silicon-containing gas is first introduced and then the hydrogen-containing gas is introduced into the reaction chamber.

In the method of HDP gap-filling with a minimization of GPN according to an embodiment of the present invention, in the second deposition step, a time interval after the silicon-containing gas is introduced into the reaction chamber and before the hydrogen-containing gas is introduced into the reaction chamber is greater than or equal to 1 seconds.

In the method of HDP gap-filling with a minimization of GPN according to an embodiment of the present invention, in the second deposition step, a time interval after the silicon-containing gas is introduced into the reaction chamber and before the hydrogen-containing gas is introduced into the reaction chamber is 1-4 seconds.

In the method of HDP gap-filling with a minimization of GPN according to an embodiment of the present invention, in the second deposition step, the hydrogen-containing gas is introduced into the reaction chamber in a manner of gradually increasing a flow rate.

In the method of HDP gap-filling with a minimization of GPN according to an embodiment of the present invention, the silicon-containing gas is a silane gas.

In the method of HDP gap-filling with a minimization of GPN according to an embodiment of the present invention, the reaction gas used in the etch step includes a fluorine-containing compound and the hydrogen-containing gas.

In the method of HDP gap-filling with a minimization of GPN according to an embodiment of the present invention, the fluorine-containing compound includes nitrogen fluoride, halothane compound or sulfur fluoride.

In the method of HDP gap-filling with a minimization of GPN, when switching from the etch step to the second deposition step, after a period of time since the carrier gas and the oxygen-containing gas are introduced into the reaction chamber, the RF power is turned on to make plasma in the reaction chamber reach a stable state, and then the silicon-containing gas and the hydrogen-containing gas are fed. Therefore, a deposition reaction can be performed in a stable state, thus achieving a minimization of GPN. Moreover, the etch step and the second deposition step are performed in-situ and in the same reaction machine. Thus, the process can be simplified and the process time is reduced effectively.

A method of HDP gap-filling with a minimization of GPN is provided. The method includes first providing a substrate having a trench. Next, a first deposition step is performed to partially fill a dielectric material in the trench. Then, an etch step is performed to partially remove the dielectric material in the trench. Thereafter, a second deposition step is performed to partially fill the dielectric material in the trench. A reaction gas used in the second deposition step includes a carrier gas, an oxygen-containing gas, a silicon-containing gas and a hydrogen-containing gas. After the carrier gas, the oxygen-containing gas and the silicon-containing gas are introduced into the reaction chamber and an RF power is turned on for a period of time, the hydrogen-containing gas is introduced into the reaction chamber.

In the method of HDP gap-filling with a minimization of GPN according to an embodiment of the present invention, the method further includes repeating the etch step and the second deposition step until the dielectric material fills up the trench.

In the method of HDP gap-filling with a minimization of GPN according to an embodiment of the present invention, the reaction gas used in the first deposition step includes the carrier gas, the oxygen-containing gas, the silicon-containing gas and the hydrogen-containing gas. After the carrier gas, the oxygen-containing gas and the silicon-containing gas are introduced into the reaction chamber and the RF power is turned on for a period of time, the hydrogen-containing gas is introduced into the reaction chamber.

In the method of HDP gap-filling with a minimization of GPN according to an embodiment of the present invention, the carrier gas is an inert gas.

In the method of HDP gap-filling with a minimization of GPN according to an embodiment of the present invention, the silicon-containing gas is a silane gas.

In the method of HDP gap-filling with a minimization of GPN according to an embodiment of the present invention, the reaction gas used in the etch step includes a fluorine-containing compound and hydrogen-containing gas.

In the method of HDP gap-filling with a minimization of GPN according to an embodiment of the present invention, the fluorine-containing compound includes nitrogen fluoride, halothane compound or sulfur fluoride.

In the method of HDP gap-filling with a minimization of GPN according to an embodiment of the present invention, in the second deposition step, a time interval after the silicon-containing gas is introduced into the reaction chamber and before the hydrogen-containing gas is introduced into the reaction chamber is greater than or equal to 1 seconds.

In the method of HDP gap-filling with a minimization of GPN according to an embodiment of the present invention, in the second deposition step, a time interval after the silicon-containing gas is introduced into the reaction chamber and before the hydrogen-containing gas is introduced into the reaction chamber is 1-4 seconds.

In the method of HDP gap-filling with a minimization of GPN according to an embodiment of the present invention, in the second deposition step, the hydrogen-containing gas is introduced into the reaction chamber in a manner of gradually increasing a flow rate.

In the above method of HDP gap-filling with a minimization of GPN, when switching from the etch step to the second deposition step, after the carrier gas, the oxygen-containing gas and the silicon-containing gas are introduced into the reaction chamber and the RF power is turned on for a period of time to make the plasma in the reaction chamber reach a stable state, the hydrogen-containing gas is fed. As the silicon-containing gas has been completely dissociated in advance in the reaction chamber, a deposition reaction is performed in a stable state, thus achieving the minimization of GPN. Moreover, the etch step and the second deposition step are performed in-situ and in the same reaction machine. Thus, the process can be simplified and the process time is reduced effectively.

A method of HDP gap-filling with a minimization of GPN is provided. The method includes first providing a substrate having a trench. Next, a first deposition step is performed to partially fill a dielectric material in the trench. Then, an etch step is performed to partially remove the dielectric material in the trench. Thereafter, a second deposition step is performed to partially fill the dielectric material in the trench. A reaction gas used in the second deposition step includes a carrier gas, an oxygen-containing gas, and a silicon-containing gas. Afterwards, a third deposition step is then performed to partially fill the dielectric material in the trench. The reaction gas used in the third deposition step includes a carrier gas, an oxygen-containing gas, a silicon-containing gas and a hydrogen-containing gas.

In the method of HDP gap-filling with a minimization of GPN according to an embodiment of the present invention, the method further includes repeating the etch step, the second deposition step, and the third deposition step until the dielectric material fills up the trench.

In the method of HDP gap-filling with a minimization of GPN according to an embodiment of the present invention, the reaction gas used in the first deposition step includes the carrier gas, the oxygen-containing gas, the silicon-containing gas and the hydrogen-containing gas.

In the method of HDP gap-filling with a minimization of GPN according to an embodiment of the present invention, the carrier gas is an inert gas.

In the method of HDP gap-filling with a minimization of GPN according to an embodiment of the present invention, the silicon-containing gas is a silane gas.

In the method of HDP gap-filling with a minimization of GPN according to an embodiment of the present invention, the reaction gas used in the etch step includes a fluorine-containing compound and the hydrogen-containing gas.

In the method of HDP gap-filling with a minimization of GPN according to an embodiment of the present invention, the fluorine-containing compound includes nitrogen fluoride, halothane compound or sulfur fluoride.

In the method of HDP gap-filling with a minimization of GPN, the second deposition step is arranged between the etch step and the third deposition step, and the second deposition step is used to make the plasma in the reaction chamber reach a stable state. Therefore, after directly switching from the second deposition step to the third deposition step, the third deposition step can be performed under a stable state, thus achieving the minimization of GPN.

In order to make the aforementioned and other objects, features and advantages of the present invention comprehensible, preferred embodiments accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The First Embodiment

Figure 1:
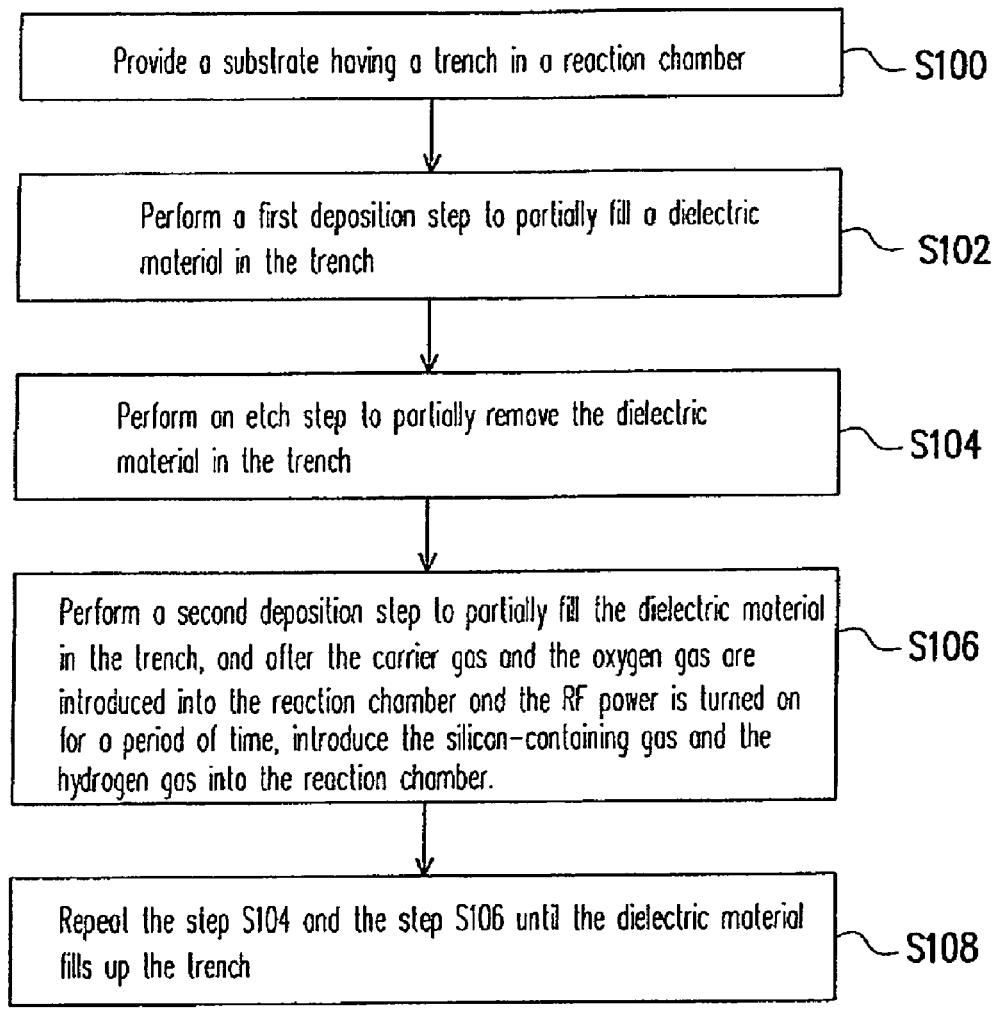
FIG. 1 is a flow chart of a method of HDP gap-filling with a minimization of GPN according to a first embodiment of the present invention.

FIG. 1 is a flow chart of a method of HDP gap-filling with a minimization of GPN according to a first embodiment of the present invention. FIGS. 2A to 2E are sectional views of a process of forming a trench isolation structure according to an embodiment of the present invention. In the following embodiment, for example, the formation of the trench isolation structure is illustrated. Definitely, the method of HDP gap-filling with a minimization of GPN of the present invention can also be used in a process of forming an interlayer dielectric layer between patterns of conductive layers such as gate electrode layer or metal layer.

Figure 2A:
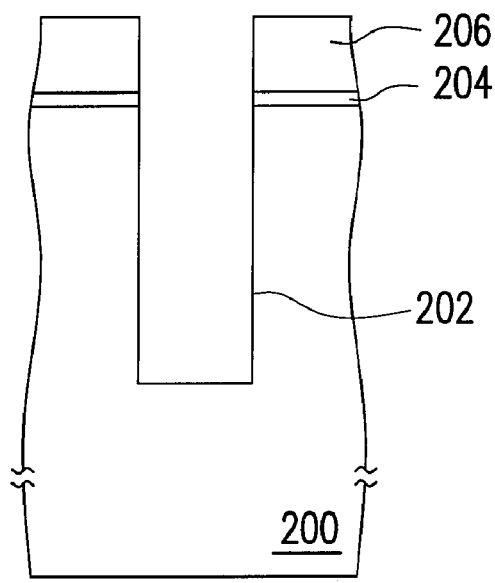
FIGS. 2A to 2E are sectional views of a process of forming a trench isolation structure according to an embodiment of the present invention.

Referring to FIG. 1 and FIG. 2A together, a step S100 is performed first. A substrate 200 having a trench 202 is provided in a reaction chamber. The material of the substrate 200 is, for example, a silicon substrate. The method of forming the trench 202 is described as follows. First, a pad oxide 204 and a mask layer 206 are formed all over the substrate 200 sequentially. The material of the pad oxide 204 is, for example, silicon oxide. The pad oxide 204 is formed by, for example, performing a thermal oxidation process. The material of the mask layer 206 is, for example, silicon nitride. The mask layer 206 is formed by, for example, performing a CVD process.

Then, the mask layer 206 and the pad oxide 204 are patterned to expose the surface of the substrate 200 where the trench 202 is to be formed. The substrate 200 is etched with the patterned mask layer 206 and pad oxide 204 as etching masks, so as to form the trench 202. The reaction chamber is, for example, a reaction chamber of high density plasma (HDP) etching machine.

Figure 2B:
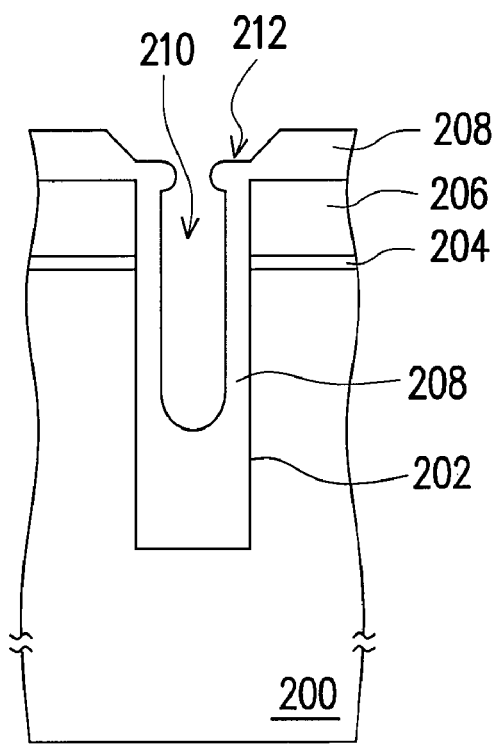

Referring to FIG. 1 and FIG. 2B together, a step S102 is performed. A first deposition step is performed to partially fill a dielectric material 208 in the trench 202. The method for forming the dielectric material 208 is, for example, a high density plasma chemical vapor deposition (HDPCVD) process, atmospheric pressure chemical vapor deposition (APCVD) process, or sub-atmospheric chemical vapor deposition (SACVD) process. If the dielectric material 208 is silicon oxide, a reaction gas used in the first deposition step includes a carrier gas, an oxygen-containing gas, a silicon-containing gas and a hydrogen-containing gas. The carrier gas includes an inert gas, for example, Ar, He, Ne, Kr, Xe, nitrogen gas ($N_2$) and a mixture thereof. The oxygen-containing gas includes, for example, oxygen ($O_2$), ozone ($O_3$), nitric oxide (NO), nitrous oxide ($N_2O$), and a mixture thereof. The silicon-containing gas includes a silane gas (in the present invention, the silane gas is a general term of a silane compound and derivatives thereof), for example, $SiH_4$, $Si_2H_6$, $Si_3H_8$, tetrasilane ($Si_4H_{10}$), tetraethyl orthosilicate (TEOS), tetramethyl-cyclotetrasiloxane (TMCTS), octamethyl-cyclotetrasiloxane (OMCTS), methyl-silane, dimethyl-silane, trimethylsilane, tetramethylsilane, tetramethyl-disiloxane (TMDSO), tetramethyl-diethoxyl-disiloxane (TMDDSO), dimethyl-dimethoxyl-silane (DMDMS), and a mixture thereof. The hydrogen-containing gas includes, for example, hydrogen ($H_2$) and an isotope thereof (deuterium and tritium), and ammonia ($NH_3$).

Besides the above gases, according to the dielectric material 208 to be deposited, the reaction gas can also contain other dopant gases. For example, if the dielectric material 208 is phosphosilicate glass (PSG) or borophosphosilicate glass (BPSG), the reaction gas further contains $PH_3$ and/or $B_2H_6$, triethylborate (TEB) and/or triethylphosphate (TEPO). If the dielectric material 208 is nitrogen-containing silicon oxide, the reaction gas further contains $N_2$, $NH_3$, NO, $N_2O$, and a mixtures thereof.

Moreover, as shown in FIG. 2B, the dielectric material 208 does not fill up the trench 202, but an opening 210 is formed, and dangles 212 are formed at corners of the mask layer 206. The dangles 212 increase the difficulty in filling the dielectric material 208 in the trench 202.

Figure 2C:
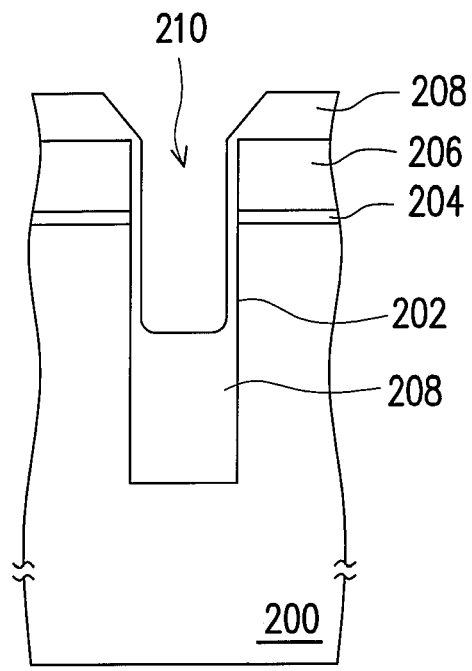

Referring to FIG. 1 and FIG. 2C together, a step S104 is performed. An etch step is performed to partially remove the dielectric material 208 in the trench 202, so as to remove the dangles 212 and expand the width of the opening 210. The reaction gas used in the etch step includes a fluorine-containing compound and a hydrogen-containing gas. The fluorine-containing compound is, for example, nitrogen fluoride, halothane compound, or sulfur fluoride.

Figure 2D:
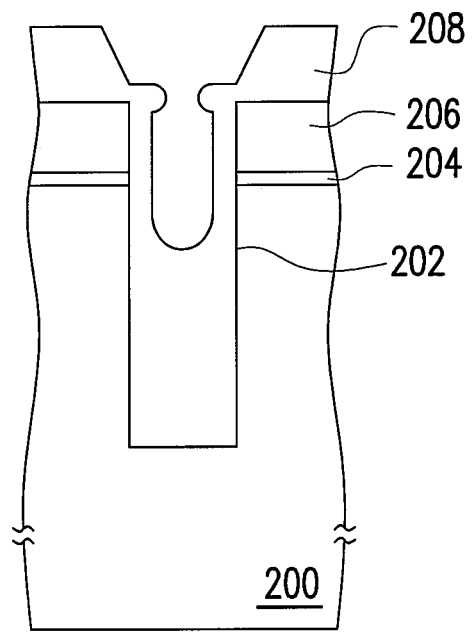

Referring to FIG. 1 and FIG. 2D together, a step S106 is performed. A second deposition step is performed to partially fill the dielectric material 208 in the trench 202. The reaction gas used in the second deposition step includes a carrier gas, an oxygen-containing gas, a silicon-containing gas and a hydrogen-containing gas. After the carrier gas and oxygen-containing gas are introduced into the reaction chamber and the RF power is turned on for a period of time, the silicon-containing gas and hydrogen-containing gas are introduced into the reaction chamber. The second deposition step is subsequent to the etch step. When switching from the etch step to the second deposition step, if the reaction gases (the carrier gas, the oxygen-containing gas, the silicon-containing gas, and the hydrogen-containing gas) are introduced into the reaction chamber at the same time, the plasma in the reaction chamber is in an unstable state to increase the RF reflectance power, so that the dissociation and nucleation of the silicon-containing gas are not thoroughly performed and the silicon-containing gas cluster are easily formed. Moreover, the hydrogen-containing gas and the oxygen-containing gas react to generate water, and the silicon-containing gas cluster reacts with the generated water, resulting in the defect of GPN formed and adhered on the substrate. In this embodiment, when switching from the etch step to the second deposition step, the carrier gas and the oxygen-containing gas are introduced into the reaction chamber for a period of time to remove the gas residues of the etch step (equivalent to a cleaning step), and the RF power is turned on to make the plasma in the reaction chamber reach a stable state, and then the silicon-containing gas and the hydrogen-containing gas are introduced. Thus, the deposition reaction can be performed under a stable state, thus achieving the minimization of GPN.

In the second deposition step, the method for forming the dielectric material 208 is, for example, an HDPCVD process, an APCVD process or a SACVD process. If the dielectric material 208 is silicon oxide, the reaction gas used in the second deposition step includes a carrier gas, an oxygen-containing gas, a silicon-containing gas and a hydrogen-containing gas. The carrier gas includes an inert gas, for example, Ar, He, Ne, Kr, Xe, nitrogen gas ($N_2$) and a mixture thereof. The oxygen-containing gas includes, for example, oxygen ($O_2$), ozone ($O_3$), nitric oxide (NO) nitrous oxide ($N_2O$), and a mixture thereof. The silicon-containing gas includes a silane gas, for example, $SiH_4$, $Si_2H_6$, $Si_3H_8$, tetrasilane ($Si_4H_{10}$), tetraethyl orthosilicate (TEOS), tetramethyl-cyclotetrasiloxane (TMCTS), octamethyl-cyclotetrasiloxane (OMCTS), methyl-silane, dimethyl-silane, trimethylsilane, tetramethylsilane, tetramethyl-disiloxane (TMDSO), tetramethyl-diethoxyl-disiloxane (TMDDSO), dimethyl-dimethoxyl-silane (DMDMS), and a mixture thereof. The hydrogen-containing gas includes, for example, hydrogen ($H_2$) and an isotope thereof (deuterium and tritium), and ammonia ($NH_3$).

Besides the above gases, according to the dielectric material 208 to be deposited, the reaction gas can also contain other dopant gases. For example, if the dielectric material 208 is phosphosilicate glass (PSG) or borophosphosilicate glass (BPSG), the reaction gas further contains $PH_3$ and/or $B_2H_6$, triethylborate (TEB) and/or triethylphosphate (TEPO). If the dielectric material 208 is nitrogen-containing silicon oxide, the reaction gas contains $N_2$, $NH_3$, NO, $N_2O$, and a mixture thereof.

Figure 2E:
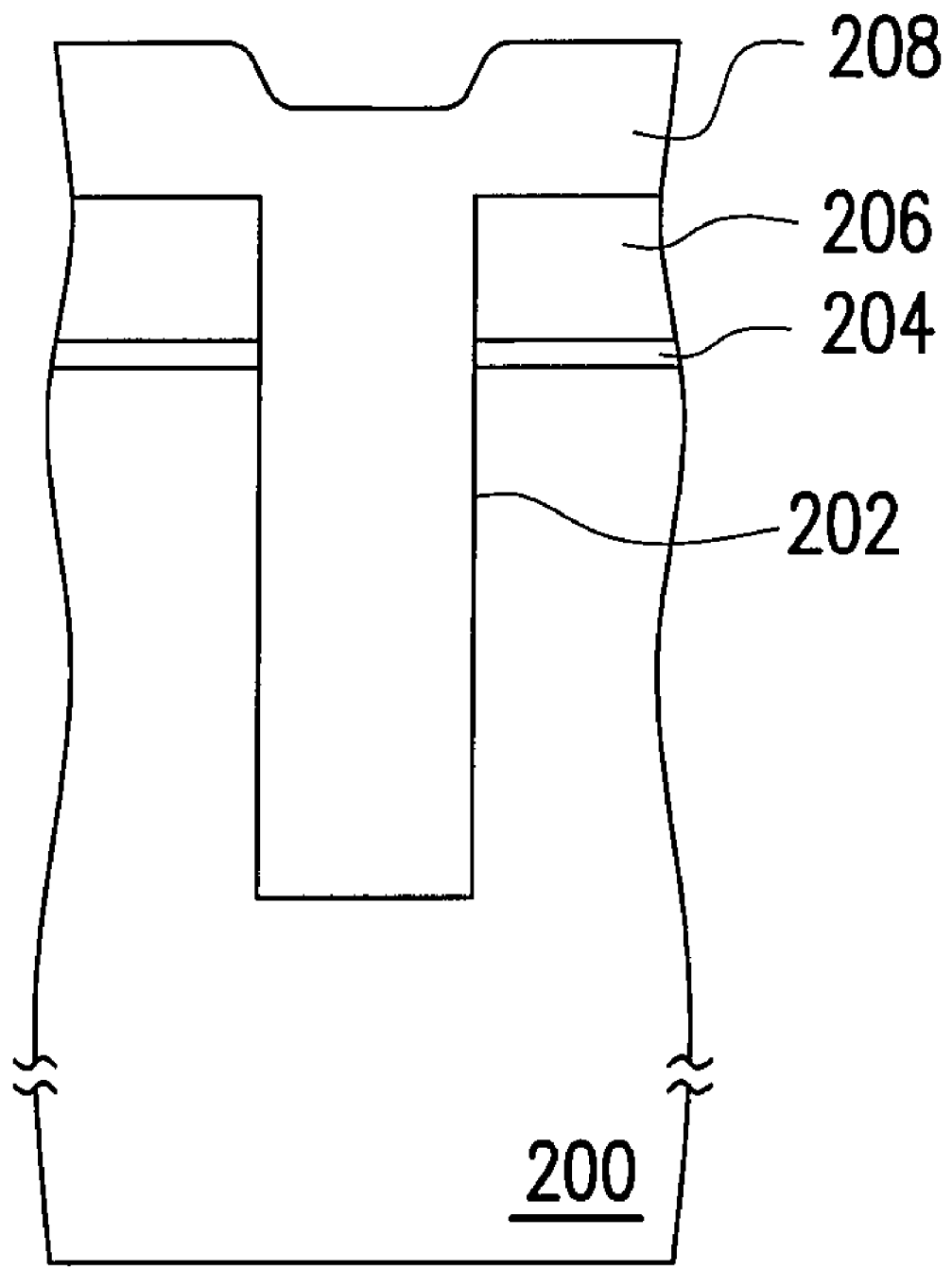

Referring to FIG. 1 and FIG. 2E together, the step S1104 and the step S1106 are repeated until the dielectric material 208 fills up the trench 202. In this step, the etch step and the deposition step are repeated until the dielectric material fills up the trench. Similarly, when switching from the etch step to the deposition step, after a period of time since the carrier gas and the oxygen-containing gas are introduced into the reaction chamber, the RF power is turned on to make the plasma in the reaction chamber reach a stable state, and then the silicon-containing gas and the hydrogen-containing gas are introduced. Thus, the deposition reaction can be performed under a stable state, thus achieving the minimization of GPN.

It should be noted that the reaction gases used in the first deposition step and the second deposition step can be the same or different. For example, the reaction gases in the first deposition step includes using He or $N_2$ as carrier gas, tetraethyl orthosilicate as silicon-containing gas, and oxygen or ozone as oxygen-containing gas; the reaction gases in the second deposition step includes using He or $N_2$ as carrier gas, silane as silicon-containing gas, oxygen as oxygen-containing gas, and hydrogen ($H_2$) or an isotope thereof (deuterium and tritium) as hydrogen-containing gas.

Definitely, in the second deposition step, after the carrier gas and oxygen-containing gas are introduced into the reaction chamber and the RF power is turned on for a period of time, the silicon-containing gas is first introduced and then the hydrogen-containing gas is introduced into the reaction chamber. Moreover, a time interval after the silicon-containing gas is introduced into the reaction chamber and before the hydrogen-containing gas is introduced into the reaction chamber is greater than or equal to 1 second, preferably 1-4 seconds. Further, in the second deposition step, the hydrogen-containing gas can be introduced into the reaction chamber in a manner of gradually increasing a flow rate. The advantage of doing so is to assure that the hydrogen-containing gas and the oxygen-containing gas do not react to generate water which would result in a mount of the defect of GPN, before the silicon-containing gas dissociates completely. In the first embodiment of the present invention, the RF power is, for example, a high frequency RF power. A low frequency RF power can be turned on continuously in the whole process.

In the first embodiment of the present invention, when switching from the etch step to the deposition step, after a period of time since the carrier gas and the oxygen-containing gas are introduced into the reaction chamber, the RF power is turned on to make the plasma in the reaction chamber reach a stable state, and then the silicon-containing gas and the hydrogen-containing gas are introduced. Therefore, the deposition reaction can be performed in a plasma stable state, thus achieving the minimization of GPN. Moreover, the etch step and the deposition step are performed in-situ, for example, in the same reaction machine. Thus, the process can be simplified and the process time is reduced effectively.

Moreover, in the first embodiment of the present invention, the second deposition step can be performed by introducing the carrier gas and the oxygen-containing gas first, then feeding the silicon-containing gas, and afterwards feeding the hydrogen-containing gas. In this manner, the effect of the minimization of GPN can also be achieved.

The Second Embodiment

Figure 3:
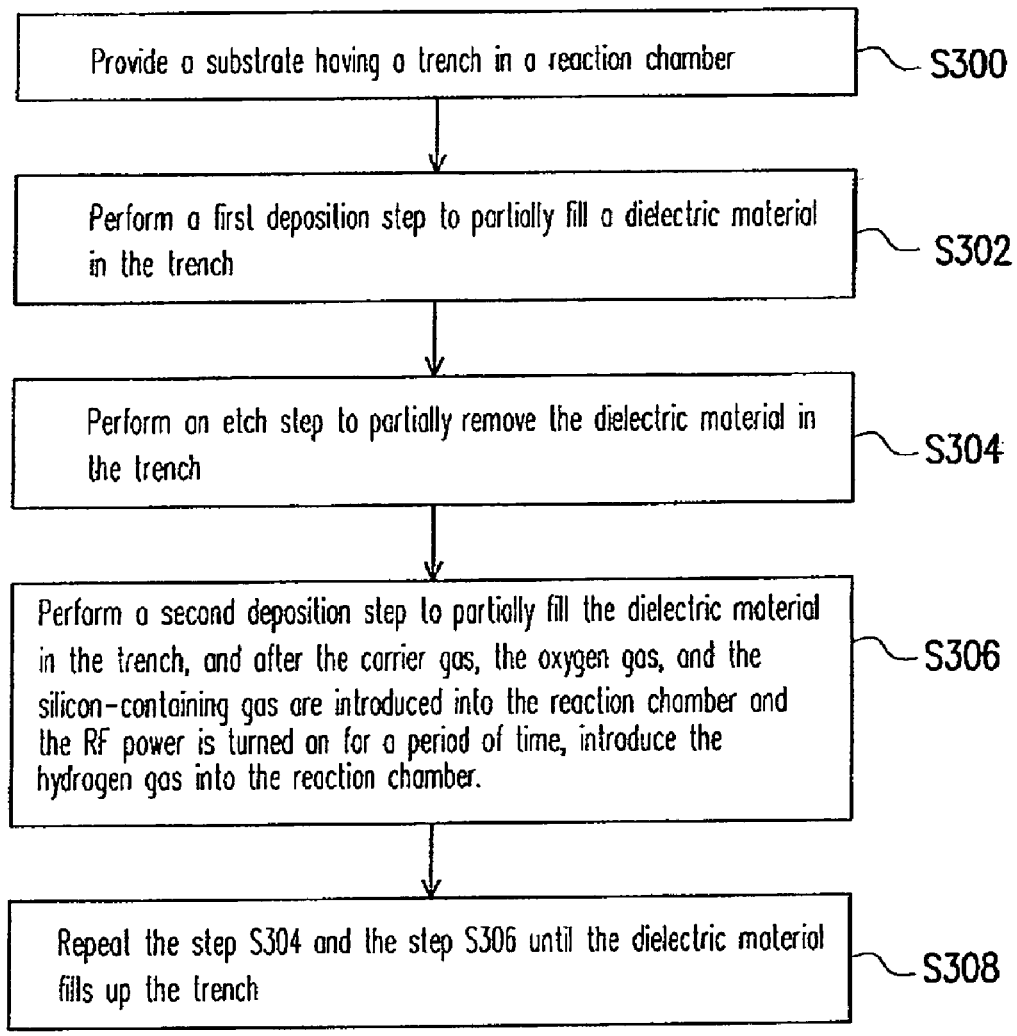
FIG. 3 is a flow chart of a method of HDP gap-filling with a minimization of GPN according to a second embodiment of the present invention.

FIG. 3 is a flow chart of a method of HDP gap-filling with a minimization of GPN according to a second embodiment of the present invention. In the following description, only the differences between this embodiment and the first embodiment are illustrated in detail.

Referring to FIG. 3, a step S300 is performed first. A substrate having a trench is provided in a reaction chamber.

Next, a step S302 is performed. A first deposition step is performed to partially fill a dielectric material in the trench. The method for forming the dielectric material is, for example, an HDP CVD process. The reaction gas used in the first deposition step includes a carrier gas, an oxygen-containing gas, a silicon-containing gas, and a hydrogen-containing gas. The carrier gas, the oxygen-containing gas, the silicon-containing gas and the hydrogen-containing gas used in the first deposition step are the same as those in the first embodiment.

Then, a step S304 is performed. An etch step is performed to partially remove the dielectric material in the trench. The reaction gas used in the etch step includes a fluorine-containing compound and hydrogen-containing gas. The fluorine-containing compound and the hydrogen-containing gas used in this embodiment is the same as that in the first embodiment.

Thereafter, a step S306 is performed. A second deposition step is performed to partially fill the dielectric material in the trench. The reaction gas used in the second deposition step includes a carrier gas, an oxygen-containing gas, a silicon-containing gas and a hydrogen-containing gas. After the carrier gas, the oxygen-containing gas and the silicon-containing gas are introduced into the reaction chamber and the RF power is turned on for a period of time, the hydrogen-containing gas is introduced into the reaction chamber. A time interval after the silicon-containing gas is introduced into the reaction chamber and before the hydrogen-containing gas is introduced into the reaction chamber is, for example, greater than or equal to 1 second, preferably 1-4 seconds. In this embodiment, when switching from the etch step to the second deposition step, after the carrier gas, the oxygen-containing gas and the silicon-containing gas are introduced into the reaction chamber and the RF power is turned on for a period of time to make the plasma in the reaction chamber reach a stable state, the hydrogen-containing gas is fed. As the silicon-containing gas has been completely dissociated in advance in the reaction chamber, a deposition reaction can be performed in a plasma stable state, thus achieving the minimization of GPN. The carrier gas, the oxygen-containing gas, the silicon-containing gas and the hydrogen-containing gas used in the second deposition step are the same as those in the first embodiment.

After that, a step S308 is performed to repeat the step S304 and the step S306 until the dielectric material fills up the trench. In this step, the etch step and the deposition step are repeated until the dielectric material fills up the trench. Similarly, when switching from the etch step to the deposition step, after the carrier gas, the oxygen-containing gas and the silicon-containing gas are first introduced into the reaction chamber and the RF power is turned on for a period of time to make the plasma in the reaction chamber reach a stable state, the hydrogen-containing gas is fed. Therefore, the deposition reaction can be performed in a plasma stable state, thus achieving the minimization of GPN. In this embodiment, the reaction gases used in the first deposition step and the second deposition step can be the same as or different form that in the first embodiment. In this embodiment, the RF power is, for example, a high frequency RF power. A low frequency RF power can be turned on continuously in the whole process.

In the second embodiment of the present invention, when switching from the etch step to the second deposition step, after the carrier gas, the oxygen-containing gas and the silicon-containing gas are introduced into the reaction chamber and the RF power is turned on for a period of time to make the plasma in the reaction chamber reach a stable state, the hydrogen-containing gas is fed. As the silicon-containing gas has been completely dissociated in advance in the reaction chamber, a deposition reaction can be performed in a stable state, thus achieving the minimization of GPN. Moreover, the etch step and the deposition step are performed in-situ, for example, in the same reaction machine. Thus, the process can be simplified and the process time is reduced effectively.

The Third Embodiment

Figure 4:
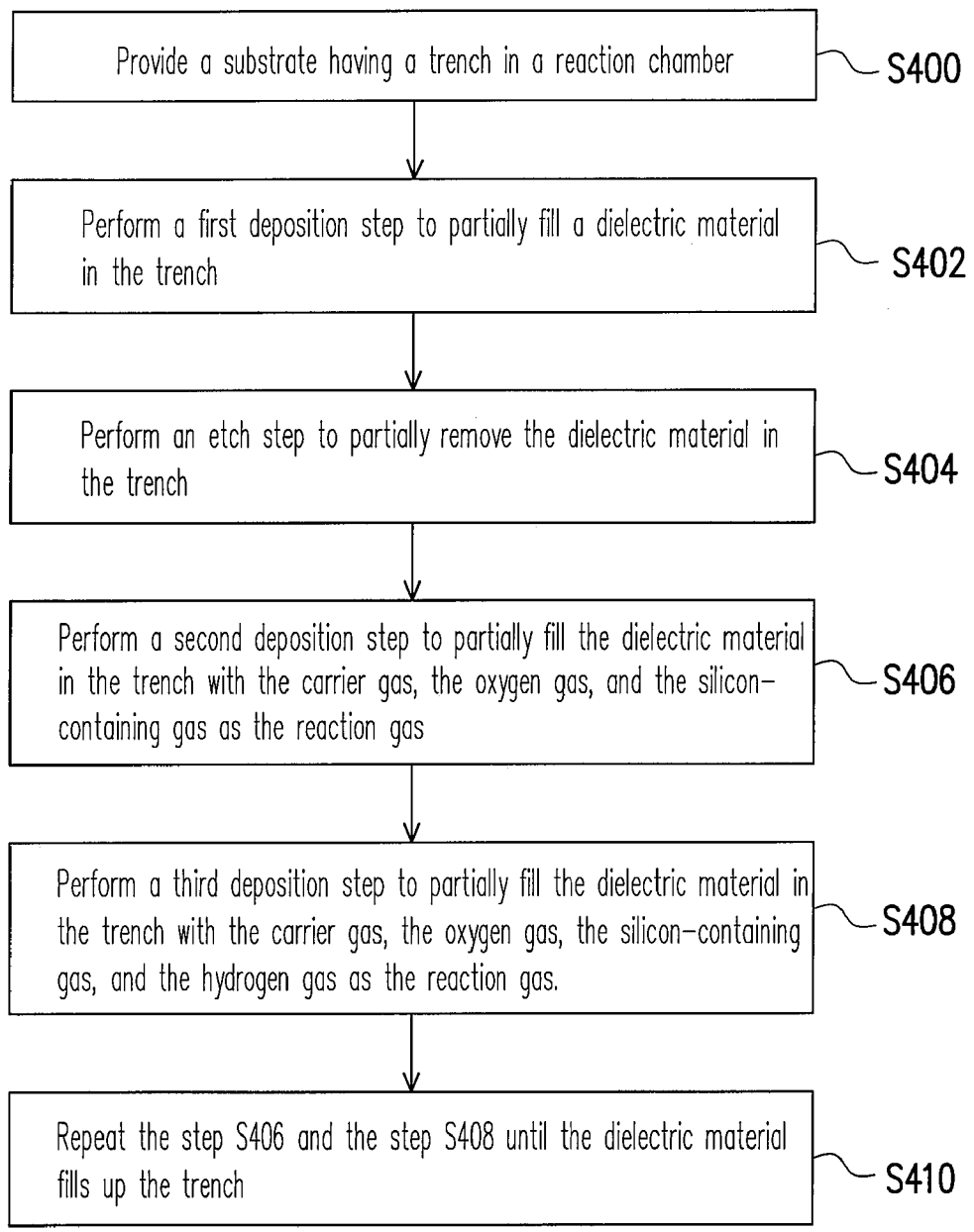
FIG. 4 is a flow chart of a method of HDP gap-filling with a minimization of GPN according to a third embodiment of the present invention.

FIG. 4 is a flow chart of a method of HDP gap-filling with a minimization of GPN according to a third embodiment of the present invention. In the following description, only the differences between this embodiment and the first embodiment and the second embodiment are illustrated in detail.

Referring to FIG. 4, a step S400 is performed first. A substrate having a trench is provided in a reaction chamber.

Next, a step S402 is performed. A first deposition step is performed to partially fill a dielectric material in the trench. The method for forming the dielectric material is, for example, an HDP CVD process. The reaction gas used in the first deposition step includes a carrier gas, an oxygen-containing gas, a silicon-containing gas, and a hydrogen-containing gas. The carrier gas, the oxygen-containing gas, the silicon-containing gas, and the hydrogen-containing gas used in the first deposition step are the same as those in the first embodiment.

Then, a step S404 is performed. An etch step is performed to partially remove the dielectric material in the trench. The reaction gas used in the etch step includes a fluorine-containing compound and hydrogen-containing gas. The fluorine-containing compound and hydrogen-containing gas used in this embodiment is the same as that in the first embodiment.

Thereafter, a step S406 is performed. A second deposition step is performed to partially fill the dielectric material in the trench. The reaction gas used in the second deposition step includes a carrier gas, an oxygen-containing gas and a silicon-containing gas. The carrier gas, the oxygen-containing gas and the silicon-containing gas used in the second deposition step are the same as those in the first embodiment. When switching from the etch step to the second deposition step, as the hydrogen-containing gas is not introduced into the reaction chamber, the reaction gas will not react seriously, and only a layer of thin dielectric material is formed on the surface of the substrate. Moreover, as the hydrogen-containing gas is not introduced into the reaction chamber, no steam is generated in the reaction chamber. Further, the plasma in the reaction chamber will reach a stable state.

Then, a step S408 is performed. A third deposition step is performed on the substrate to partially fill the dielectric material in the trench. The reaction gas used in the third deposition step includes a carrier gas, an oxygen-containing gas, a silicon-containing gas and a hydrogen-containing gas. Since in the second deposition step, the plasma in the reaction chamber has reached a stable state, after directly switching from the second deposition step to the third deposition step, the third deposition step can be performed in a stable state, thus achieving the minimization of GPN. The carrier gas, the oxygen-containing gas, the silicon-containing gas and the hydrogen-containing gas used in the third deposition step are the same as those in the first embodiment.

Thereafter, a step S410 is performed. The step S404 to the step S408 are repeated until the dielectric material fills up the trench. In this step S410, the etch step, the second deposition step, and the third deposition step are repeated until the dielectric material fills up the trench.

In the third embodiment of the present invention, the second deposition step is arranged between the etch step and the third deposition step, and the second deposition step is used to make the plasma in the reaction chamber reach a stable state. Therefore, after directly switching from the second deposition step to the third deposition step, the third deposition step can be performed under a stable state, thus achieving the minimization of GPN.

It should be noted that the first deposition step, the etch step, the second deposition step, and the third deposition step are performed in-situ, for example, in the same reaction machine. Thus, the process can be simplified and the process time is reduced effectively.

Further, the first deposition steps in the first embodiment to the third embodiment can also adopt the same manner of the second deposition steps in the first embodiment and the second embodiment. That is, in the first deposition step, after a period of time since the carrier gas and the oxygen-containing gas are introduced into the reaction chamber, the RF power is turned on to make the plasma in the reaction chamber reach a stable state, and then the silicon-containing gas and the hydrogen-containing gas are introduced. Alternatively, after the carrier gas, the oxygen-containing gas and the silicon-containing gas are introduced into the reaction chamber and the RF power is turned on for a period of time to make the plasma in the reaction chamber reach a stable state, the hydrogen-containing gas is fed.

Hereinafter, it is proved the present invention can achieve the minimization of the GPN according to an experimental example (after the carrier gas, the oxygen-containing gas and the silicon-containing gas are introduced for a period of time, the hydrogen-containing gas is introduced) and a conventional example (all reaction gases are introduced at the same time at the beginning of the process).

Figure 5:
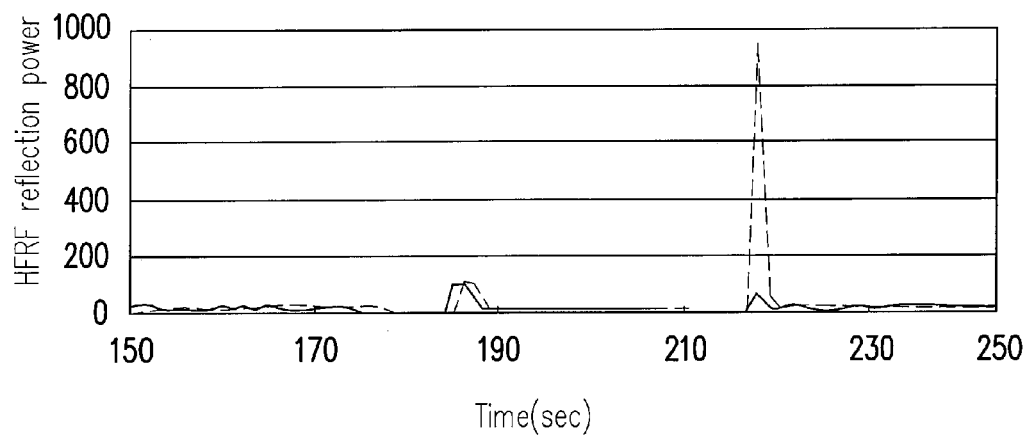
FIG. 5 is a diagram of a relation between a process time and a high frequency RF reflection power.
Figure 6:
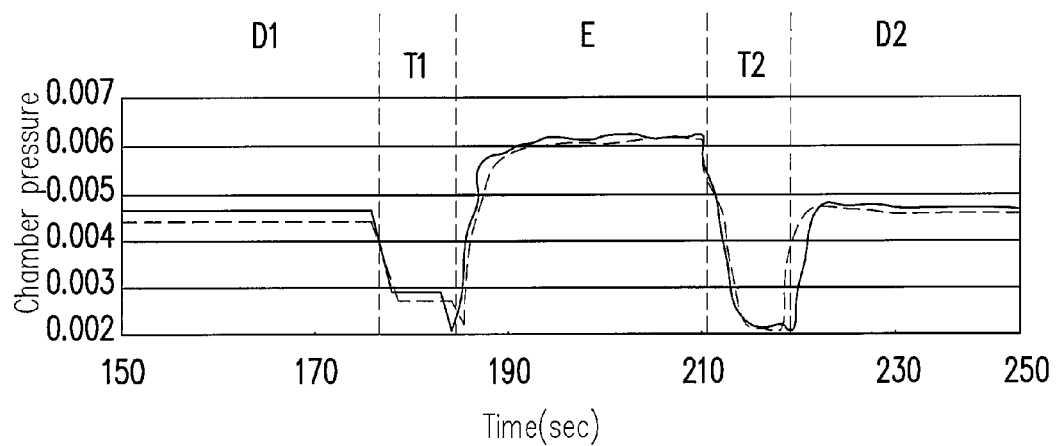
FIG. 6 is a diagram of a relation between a process time and a reaction chamber pressure.

FIG. 5 is a diagram of a relation between a process time and a high frequency RF reflection power. FIG. 6 is a diagram of a relation between a process time and a reaction chamber pressure. In FIG. 5 and FIG. 6, the process time is divided into five intervals, i.e., a first deposition step D1, a first switching step T1, an etch step E, a second switching step T2, and a second deposition step D2. In FIG. 5 and FIG. 6, the experimental example of the present invention is indicated by solid lines, and the conventional example is indicated by dashed lines. The preferred process parameters are listed in table 1.

TABLE 1

| process parameters | First deposition step D1 | Etch step E | Second deposition step D2 |
|---|---|---|---|
| SiH$_4$ flow rate (sccm) | 80 | 0 | 80 |
| O$_2$ flow rate (sccm) | 144 | 0 | 144 |
| He flow rate (sccm) | 300 | 200 | 300 |
| H$_2$ flow rate (sccm) | 400 | 500 | 400 |
| NF$_3$ flow rate (sccm) | 0 | 200 | 0 |
| Low frequency RF power (W) | 5000 | 2200 | 5000 |
| High frequency RF power(W) | 3600 | 1500 | 3600 |
| Process pressure (mTorr) | 5.5 | 7 | 5.5 |
| Process temperature(° C.) | 534 | 400 | 534 |

As shown in FIG. 5 and FIG. 6, according to the conventional example (indicated by the dashed lines), in the first switching step T1 and the second switching step T2, the high frequency RF reflection power increases. Particularly, in the second switching step T2 between the etch step E and the second deposition step D2, the high frequency RF reflection power is especially high. That is because the plasma in the reaction chamber is in an unstable state to increase the RF reflectance power, so that the dissociation and nucleation of the silicon-containing gas are not thoroughly performed. Moreover, the hydrogen-containing gas and the oxygen-containing gas react to generate water, and the silicon-containing gas cluster reacts with the generated water to result in the formation of the defect of GPN.

In the experimental example (indicated by solid lines) of the method of HDP gap-filling with a minimization of GPN provided by the present invention, in the second switching step T2 between the etch step E and the second deposition step D2, the high frequency RF reflection power is reduced significantly, thus achieving the minimization of GPN.

In view of the above, in the method of HDP gap-filling with a minimization of GPN according to the present invention, when switching from the etch step to the deposition step, after the plasma in the reaction chamber reaches a stable state, the hydrogen-containing gas (or both the silicon-containing gas and the hydrogen-containing gas) is (are) fed. Therefore, the deposition reaction can be performed in the stable state, thus achieving the minimization of GPN. Moreover, the etch step and the deposition step are performed in-situ and in the same reaction machine. Thus, the process can be simplified and the process time is reduced effectively.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of high density plasma (HDP) gap-filling with a minimization of gas phase nucleation (GPN), comprising:
   (a) providing a substrate having a trench in a reaction chamber;
   (b) performing a first deposition step to partially fill a dielectric material in the trench;
   (c) performing an etch step to partially remove the dielectric material in the trench; and
   (d) performing a second deposition step to partially fill the dielectric material in the trench, wherein a reaction gas used in the second deposition step comprises a carrier gas, an oxygen-containing gas, a silicon-containing gas and a hydrogen-containing gas, and after the carrier gas and the oxygen-containing gas are introduced into the reaction chamber and a radio frequency (RF) power is turned on for a period of time, the silicon-containing gas and the hydrogen-containing gas are introduced into the reaction chamber, wherein in the second deposition step, after the carrier gas and the oxygen-containing gas are introduced into the reaction chamber and the RF power is turned on for a period of time, the silicon-containing gas is first introduced and then the hydrogen-containing gas is introduced into the reaction chamber, and a time interval after the silicon-containing gas is introduced into the reaction chamber and before the hydrogen-containing gas is introduced into the reaction chamber is greater than or equal to 1 second.

2. The method of HDP gap-filling with a minimization of GPN as claimed in claim 1, further comprising repeating step (c) and step (d) until the dielectric material fills up the trench.

3. The method of HDP gap-filling with a minimization of GPN as claimed in claim 1, wherein the reaction gas used in the first deposition step comprises the carrier gas, the oxygen-containing gas, the silicon-containing gas and the hydrogen-containing gas, and after the carrier gas and the oxygen-containing gas are introduced into the reaction chamber and the RF power is turned on for a period of time, the silicon-containing gas and the hydrogen-containing gas are introduced into the reaction chamber.

4. The method of HDP gap-filling with a minimization of GPN as claimed in claim 1, wherein the carrier gas comprises an inert gas.

5. The method of HDP gap-filling with a minimization of GPN as claimed in claim 1, wherein in the second deposition step, a time interval after the silicon-containing gas is introduced into the reaction chamber and before the hydrogen-containing gas is introduced into the reaction chamber is 1-4 seconds.

6. The method of HDP gap-filling with a minimization of GPN as claimed in claim 1, wherein in the second deposition step, the hydrogen-containing gas is introduced into the reaction chamber in a manner of gradually increasing a flow rate.

7. The method of HDP gap-filling with a minimization of GPN as claimed in claim 1, wherein the silicon-containing gas comprises a silane gas.

8. The method of HDP gap-filling with a minimization of GPN as claimed in claim 1, wherein the reaction gas used in the etch step comprises a fluorine-containing compound and hydrogen-containing gas.

9. The method of HDP gap-filling with a minimization of GPN as claimed in claim 8, wherein the fluorine-containing compound comprises nitrogen fluoride, halothane compound or sulfur fluoride.

10. A method of HDP gap-filling with a minimization of GPN, comprising:
(a) providing a substrate having a trench;
(b) performing a first deposition step to partially fill a dielectric material in the trench;
(c) performing an etch step to partially remove the dielectric material in the trench; and
(d) performing a second deposition step to partially fill the dielectric material in the trench, wherein a reaction gas used in the second deposition step comprise a carrier gas, an oxygen-containing gas, a silicon-containing gas and a hydrogen-containing gas, and after the carrier gas, the oxygen-containing gas and the silicon-containing gas are introduced into the reaction chamber and an RF power is turned on for a period of time, the hydrogen-containing gas is introduced into the reaction chamber,
wherein in the second deposition step, a time interval after the silicon-containing gas is introduced into the reaction chamber and before the hydrogen-containing gas is introduced into the reaction chamber is greater than or equal to 1 second.

11. The method of HDP gap-filling with a minimization of GPN as claimed in claim 10, further comprising repeating the step (c) and the step (d) until the dielectric material fills up the trench.

12. The method of HDP gap-filling with a minimization of GPN as claimed in claim 10, wherein the reaction gas used in the first deposition step comprises the carrier gas, the oxygen-containing gas, the silicon-containing gas and the hydrogen-containing gas, and after the carrier gas, the oxygen-containing gas and the silicon-containing gas are introduced into the reaction chamber and the RF power is turned on for a period of time, the hydrogen-containing gas is introduced into the reaction chamber.

13. The method of HDP gap-filling with a minimization of GPN as claimed in claim 10, wherein the carrier gas comprises an inert gas.

14. The method of HDP gap-filling with a minimization of GPN as claimed in claim 10, wherein the silicon-containing gas comprises a silane gas.

15. The method of HDP gap-filling with a minimization of GPN as claimed in claim 10, wherein the reaction gas used in the etch step comprises a fluorine-containing compound and hydrogen-containing gas.

16. The method of HDP gap-filling with a minimization of GPN as claimed in claim 15, wherein the fluorine-containing compound comprises nitrogen fluoride, halothane compound or sulfur fluoride.

17. The method of HDP gap-filling with a minimization of GPN as claimed in claim 10, wherein in the second deposition step, a time interval after the silicon-containing gas is introduced into the reaction chamber and before the hydrogen-containing gas is introduced into the reaction chamber is 1-4 seconds.

18. The method of HDP gap-filling with a minimization of GPN as claimed in claim 10, wherein in the second deposition step, the hydrogen-containing gas is introduced into the reaction chamber in a manner of gradually increasing a flow rate.

* * * * *